(12) United States Patent
Cho et al.

(10) Patent No.: US 11,562,943 B2
(45) Date of Patent: Jan. 24, 2023

(54) APPARATUS FOR COLLECTING BY-PRODUCT IN SEMICONDUCTOR MANUFACTURING PROCESS

(71) Applicant: MILAEBO CO., LTD., Pyeongtaek-si (KR)

(72) Inventors: Che Hoo Cho, Seongnam-si (KR); Yeon Ju Lee, Osan-si (KR); Myung Pil Han, Yongin-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 602 days.

(21) Appl. No.: 16/669,824

(22) Filed: Oct. 31, 2019

(65) Prior Publication Data

US 2021/0134701 A1    May 6, 2021

(51) Int. Cl.
  *H01L 23/473* (2006.01)
  *B01D 8/00* (2006.01)
  (Continued)

(52) U.S. Cl.
  CPC .............. *H01L 23/473* (2013.01); *B01D 8/00* (2013.01); *B01D 53/002* (2013.01);
  (Continued)

(58) Field of Classification Search
  CPC . H01L 23/427; H01L 21/02; H01L 21/67103; H01L 21/67207; H01L 21/67109; H01L 21/67017; H01L 21/67098; H01L 23/473; B01D 8/00; B01D 53/002; B01D 53/005; B01D 2258/0216; B01D 49/00; C23C 16/4412; F16T 1/00; H05K 7/20145; B08B 15/023
  See application file for complete search history.

(56) References Cited

FOREIGN PATENT DOCUMENTS

| CN | 101432847 A | 5/2009 |
|---|---|---|
| KR | 10-0717837 B1 | 5/2007 |

(Continued)

OTHER PUBLICATIONS

KR20170049225A_ENG (Espacenet machine translation of Kim) (Year: 2017).*

(Continued)

*Primary Examiner* — Jonathan Miller
*Assistant Examiner* — Gabriel E Gitman
(74) *Attorney, Agent, or Firm* — Rabin & Berdo, P.C.

(57) ABSTRACT

ABSTRACT An apparatus is for collecting a by-product in a semiconductor manufacturing process. The apparatus includes: a housing cooling channel on an inner wall thereof to cool exhaust gas which is temperature-controlled by a heater while being introduced through a gas inlet of an upper plate; an internal collecting tower including multiple vertical plates and multiple horizontal plates that are assembled, and condensing and collecting a by-product from the exhaust gas; a main cooling channel having a serpentine shape and cooling the exhaust gas uniformly by using coolant while passing through the internal collecting tower; and a multi-connection pipe sequentially supplying the coolant to the upper plate cooling channel, the housing cooling channel, and the main cooling channel and discharging the coolant, by using a supply pipe and a discharge pipe that are provided outside the housing.

12 Claims, 9 Drawing Sheets

(51) Int. Cl.
  *B01D 53/00*   (2006.01)
  *H01L 23/427*  (2006.01)
  *C23C 16/44*   (2006.01)
  *H01L 21/02*   (2006.01)
  *H01L 21/67*   (2006.01)
  *F16T 1/00*    (2006.01)

(52) U.S. Cl.
  CPC ........ *B01D 53/005* (2013.01); *C23C 16/4412* (2013.01); *F16T 1/00* (2013.01); *H01L 21/02* (2013.01); *H01L 21/67103* (2013.01); *H01L 21/67207* (2013.01); *H01L 23/427* (2013.01); *B01D 2258/0216* (2013.01)

(56) References Cited

FOREIGN PATENT DOCUMENTS

| KR | 100718692 B1 | 5/2007 | |
|----|---|---|---|
| KR | 10-0862684 B1 | 10/2008 | |
| KR | 101317626 B1 | 10/2013 | |
| KR | 10-1447629 B1 | 10/2014 | |
| KR | 20170049225 A * | 5/2017 | ............ H01L 21/02 |
| KR | 101761725 B1 | 8/2017 | |
| KR | 20170111437 A * | 10/2017 | ........... B01D 53/005 |
| KR | 10-1806480 B1 | 1/2018 | |

OTHER PUBLICATIONS

KR20170111437A_ENG (Espacenet machine translation of Choi) (Year: 2017).*

* cited by examiner

APPARATUS FOR COLLECTING BY-PRODUCT IN SEMICONDUCTOR MANUFACTURING PROCESS

BACKGROUND OF THE INVENTION

Field of the Invention

The present invention relates generally to an apparatus for collecting a by-product having a cooling line in a semiconductor manufacturing process. More particularly, the present invention relates to a collecting apparatus in which in order to efficiently collect a by-product contained in exhaust gas discharged after use in a process chamber for manufacturing a semiconductor, a cooling channel is directly introduced into an internal space of the apparatus, thus increasing efficiency of collecting the by-product by an internal collecting tower.

Description of the Related Art

Generally, a semiconductor manufacturing process is roughly classified into a fabrication process and an assembly process.

The fabrication process is a process for manufacturing semiconductor chips on which a predetermined pattern is formed by repeating a process in which a thin film is deposited on a wafer in various process chambers and the deposited thin film is selectively etched.

The assembly process is a process of individually cutting the chips manufactured on the wafer in the fabrication process, and then joining the cut chip with a lead frame to assemble into the finished product.

In detail, the fabrication process is a process of depositing a thin film on the wafer or etching a thin film deposited on the wafer. The process is performed under high-temperature conditions by supplying process gases such as silane ($SiH_4$), arsine, boron chloride, and hydrogen, and tungsten hexafluoride ($WF_6$) into a process chamber. During the process, a large amount of various ignitable gases and hazardous gases containing corrosive foreign substances and toxic components are produced inside the process chamber.

Therefore, in order to purify and discharge such hazardous gases, the semiconductor manufacturing equipment is provided with: a vacuum pump evacuating the process chamber; and a scrubber provided at a rear end of the vacuum pump to purify the exhaust gas discharged from the process chamber and to discharge the exhaust gas to the atmosphere.

However, the scrubber only treats and removes a by-product which is in a form of gas. Due to this, when the by-product is discharged externally from the process chamber and then solidified, the by-product may be adhered to an exhaust line, leading to increasing exhaust pressure. In addition, the by-product may be introduced into the vacuum pump and cause a failure of the vacuum pump and backflow of the hazardous gas into the process chamber, leading to contamination of the wafer.

In order to address such problems, the semiconductor manufacturing equipment is provided with an apparatus for collecting a by-product between the process chamber and the vacuum pump to condense exhaust gas discharged from the process chamber.

Such an apparatus for collecting a by-product in the related art is connected to the process chamber and the vacuum pump by a pumping line to condense and collect particulate by-products contained in the exhaust gas that results from reaction and is discharged from the process chamber.

The apparatus for collecting a by-product generally includes: a housing providing a space for accommodating introduced exhaust gas; an upper plate covering top of the housing, with a cooling channel for O-ring protection and maintaining an appropriate temperature for byproduct collection; an internal collecting tower condensing and collecting a by-product that is contained in exhaust gas introduced into the housing; and a heater controlling an appropriate temperature distribution in which the exhaust gas introduced into the housing can form the by-product.

The most important thing in the apparatus for collecting a by-product configured as described above is that exhaust gas comes into uniform contact with each surface of plates constituting the internal collecting tower provided inside the housing, allowing particulate toxic substances contained in the exhaust gas to be efficiently and quickly condensed and collected as a by-product.

However, in the apparatus for collecting a by-product in the related art, there is employed a method in which collection of by-products is performed while high-temperature exhaust gas, which is introduced into the housing and controlled to have an appropriate temperature distribution capable of by-product formation by the heater, comes into contact with the surfaces of plates of the internal collecting tower, or a method in which a propeller is used to change the flow of the introduced exhaust gas to spread uniformly inside the housing such that collection of by-products is performed while the exhaust gas comes into contact with the surfaces of the plates of the internal collecting tower. This causes a problem in that the temperature of an inner plate of the internal collecting tower is higher than that of an outer plate, leading to lowering condensation efficiency. Another problem is that the exhaust gas is not introduced efficiently and does not spread uniformly, and thus the amount of surface contact with the plates of the internal collecting tower is not large, leading to increasing the time the introduced exhaust gas is condensed as a by-product.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent No. 10-0717837 (May 7, 2007)

(Patent document 2) Korean Patent No. 10-0862684 (Oct. 10, 2008)

(Patent document 3) Korean Patent No. 10-1447629 (Sep. 9, 2014)

(Patent document 4) Korean Patent No. 10-1806480 (Dec. 12, 2017)

SUMMARY OF THE INVENTION

Accordingly, the present invention has been made keeping in mind the above problems occurring in the related art, and an objective of the present invention is to provide an apparatus for collecting a by-product, in which a main cooling channel passing through an internal collecting tower and a housing cooling channel provided on an inner wall of a housing are provided to cool introduced exhaust gas to form an appropriate temperature for collection in the entire housing region, and a vertical plate and a horizontal plate constituting the internal collecting tower are used to generate a vortex in the exhaust gas flow such that the exhaust gas flow is spread uniformly while being retarded, whereby a by-product condensed at high density is collected.

In order to achieve the above objective, according to one aspect of the present invention, there is provided an apparatus having a cooling line for collecting a by-product in a semiconductor manufacturing process, the apparatus being provided on a line between a process chamber and a vacuum pump to collect a by-product in exhaust gas, which is discharged from the process chamber, the apparatus including:

a housing in which the exhaust gas introduced through an upper plate having a gas inlet and an upper plate cooling channel is accommodated and then the exhaust gas is discharged through a lower plate having a gas outlet, and including a housing cooling channel on an inner wall thereof to cooling the exhaust gas which is temperature-controlled by a heater while being introduced through the gas inlet of the upper plate;

an internal collecting tower provided inside the housing at a location spaced apart upward from the lower plate by a predetermined distance, and including multiple vertical plates and multiple horizontal plates that are assembled for providing a main cooling channel installation space and generating a vortex, the internal collecting tower condensing and collecting the by-product from the exhaust gas;

a main cooling channel having a serpentine shape and cooling the exhaust gas uniformly by using coolant while passing through the internal collecting tower; and a multi-connection pipe sequentially supplying the coolant to the upper plate cooling channel, the housing cooling channel, and the main cooling channel in a circulative manner and discharging the coolant, by using a supply pipe and a discharge pipe that are provided outside the housing.

In a preferred embodiment, the housing cooling channel may be provided as multiple housing cooling channels that are arranged along the inner wall of the housing at a regular interval over upper and lower regions, such that the coolant may be supplied through the multi-connection pipe provided outside the housing.

In a preferred embodiment, the upper plate cooling channel of the upper plate may be configured such that the coolant supplied externally is introduced through a first branch socket connected to a coolant inlet of the multi-connection pipe and circulates, and then the coolant may be discharged to the multi-connection pipe through a second branch socket to be supplied to the housing cooling channel and the main cooling channel.

In a preferred embodiment, the internal collecting tower may be configured such that the multiple vertical plates and the horizontal plates are fitted together, each of the vertical plates including a gas hole and a fitting hole or a fitting piece, each of the horizontal plates including a gas hole and a fitting piece, wherein the vertical plates may be configured such that at least two spacing vertical plates are fitted to cross each two neighboring main vertical plates of multiple main vertical plates to form an interval therebetween, and a part of the multiple horizontal plates may be arranged up and down in a space between each two main vertical plates at which no spacing vertical plates are provided and provide an interval therebetween, while generating the vortex in the exhaust gas to allow flow of the exhaust gas to be retarded and spread uniformly.

In a preferred embodiment, a remaining part of the horizontal plates may be provided at each of opposite main vertical plates of the inner collecting tower so as to protrude outward such that the vortex is generated and retards the flow of the exhaust gas, and a spacing plate may be welded to a lower end portion of each of the opposite main vertical plates such that the vertical plates are spaced apart a predetermined distance from a base horizontal plate located at a lowermost portion.

In a preferred embodiment, among the horizontal plates, a base horizontal plate located at a lower portion may be configured such that a spacing plate is welded thereto, whereby the base horizontal plate may support load of all the integrally assembled vertical and horizontal plates while being spaced apart therefrom, and the base horizontal plate may include at least one pipe slit allowing the main cooling channel to pass through the internal collecting tower.

In a preferred embodiment, the gas hole formed in each of the vertical plates may be relatively larger in size than the gas hole formed in each of the horizontal plates such that introduction of the exhaust gas is performed efficiently.

In a preferred embodiment, the main cooling channel having the serpentine shape may be configured such that multiple vertical pipes and curved pipes alternately connecting upper ends and lower ends of neighboring vertical pipes to each other are arranged repeatedly up and down, whereby the coolant flowing in the main cooling channel passing through the internal collecting tower may cool surrounding exhaust gas to condense the exhaust gas at high density in upper and lower regions of the vertical plates and on surfaces of the horizontal plates, the vertical and horizontal plates constituting the internal collecting tower, and the coolant cooled surroundings while passing through the serpentine-shaped main cooling channel may be discharged through a horizontal pipe.

In a preferred embodiment, the main cooling channel may be provided as two or more main cooling channels.

In a preferred embodiment, the multi-connection pipe may include a coolant supply pipe and a coolant discharge pipe that are connected to respective branch sockets provided at a location in which the coolant is supplied to the housing cooling channel, the upper plate cooling channel, and the main cooling channel and a location in which the coolant is discharged, such that the coolant may be circulated.

In a preferred embodiment, when two or more main cooling channels are provided, the multi-connection pipe may include a coolant chamber to simultaneously supply and discharge the coolant to and from the two or more main cooling channels.

In a preferred embodiment, the heater may further include a heat distribution plate provided at a lower portion thereof by a fastening means so as to be spaced apart downward by a predetermined distance, the heat distribution plate having multiple gas holes formed in end portions thereof such that a part of the exhaust gas is supplied toward top of the internal collecting tower located below the heat distribution plate, and a remaining part of the exhaust gas is supplied toward the inner wall of the housing located sideward of the heat distribution plate.

The apparatus for collecting a by-product according to the present invention having the above characteristics has an advantage in that a cooling channel passing through the internal collecting tower uniformly cools introduced exhaust gas so as to form an appropriate temperature for collection, thus collecting a by-product condensed at high density.

The present invention has another advantage in that the vertical plates constituting the internal collecting tower generate a vortex in the flow of introduced exhaust gas, allowing the exhaust gas to spread uniformly while increasing the time the exhaust gas stays in the internal collecting tower, whereby a by-product condensed at high density is collected from the exhaust gas.

The present invention has still another advantage in that a cooling channel is introduced into the inner wall of the housing together with a cooling channel passing through the internal capture tower constituting the apparatus for collecting a by-product, whereby introduced exhaust gas is condensed even on the inner wall of the housing and a by-product condensed at high density is collected thereon.

The present invention is a useful invention having various advantages as described above and is expected to find wide application in industry.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Hereinafter, the configuration and the operation of exemplary embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted.

Figure 1:
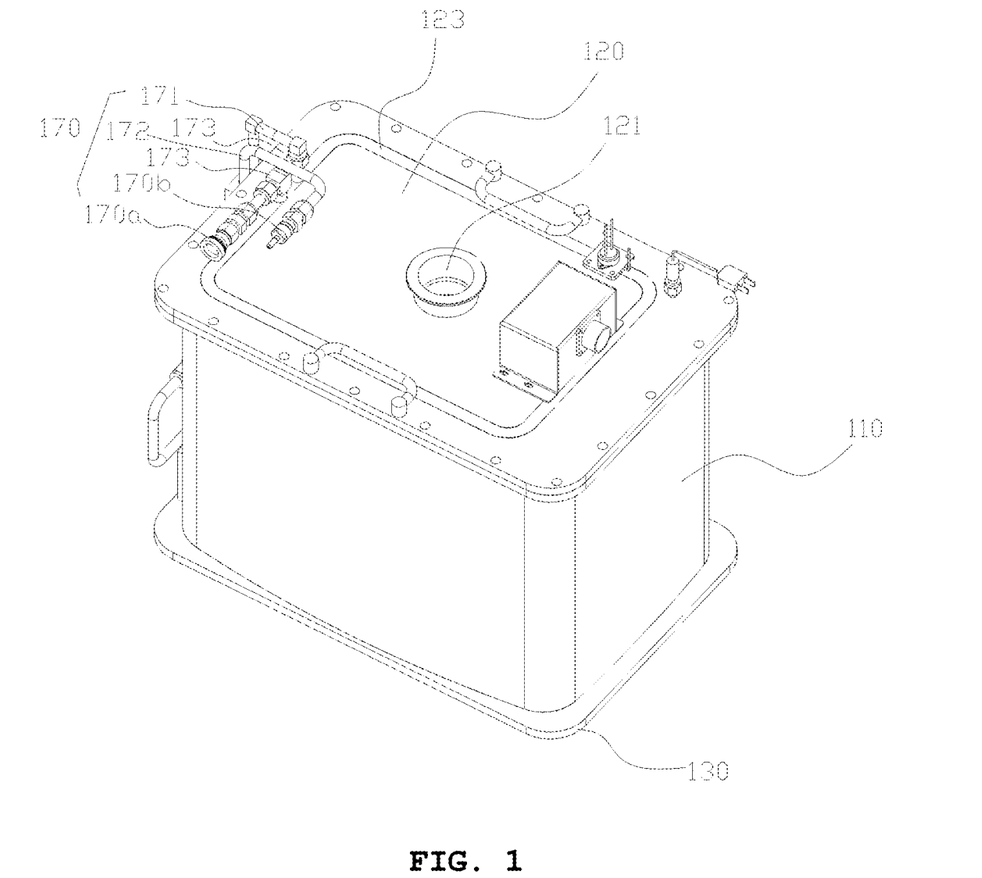
FIG. 1 is a perspective view showing an apparatus for collecting a by-product according to one embodiment of the present invention.
Figure 2:
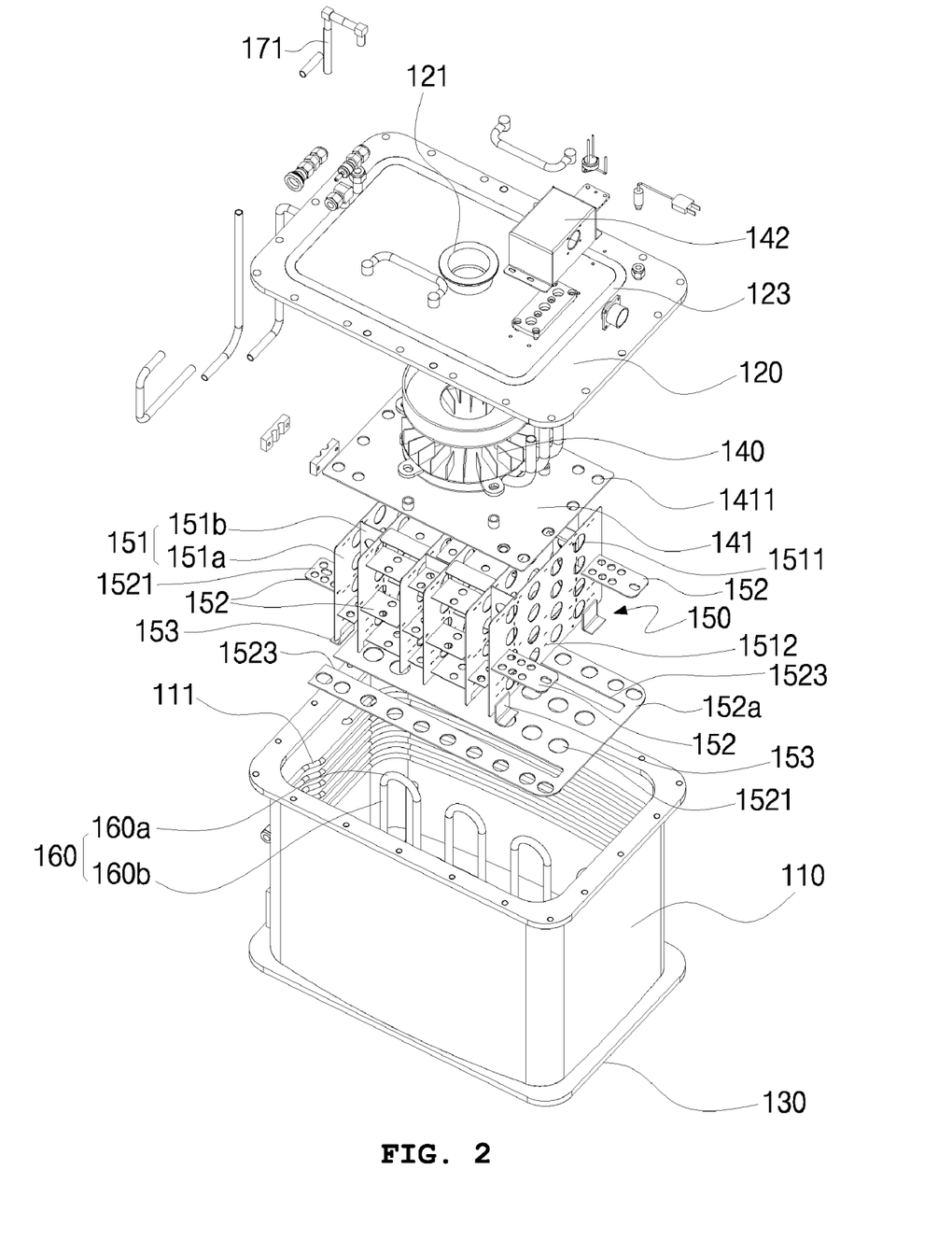
FIG. 2 is an exploded perspective view showing the apparatus for collecting a by-product according to one embodiment of the present invention.
Figure 3:
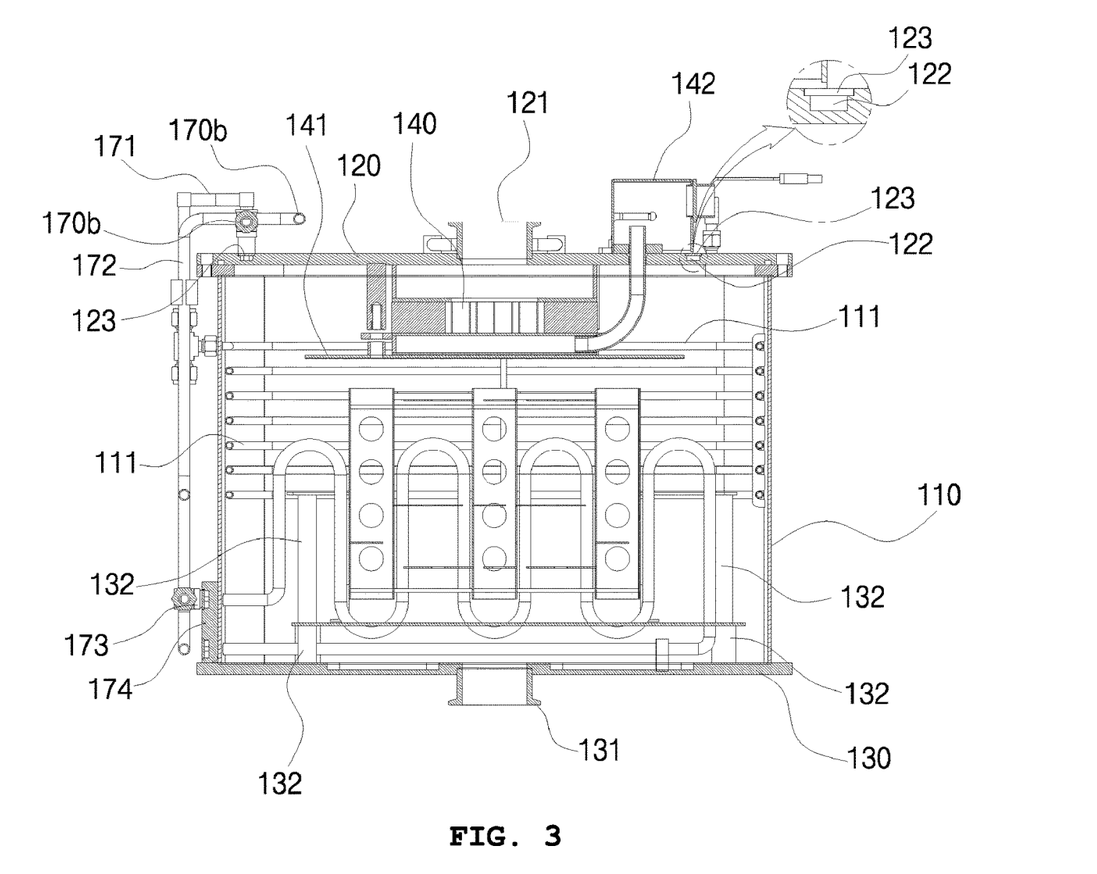
FIG. 3 is a front sectional view showing the apparatus for collecting a by-product according to one embodiment of the present invention.
Figure 4:
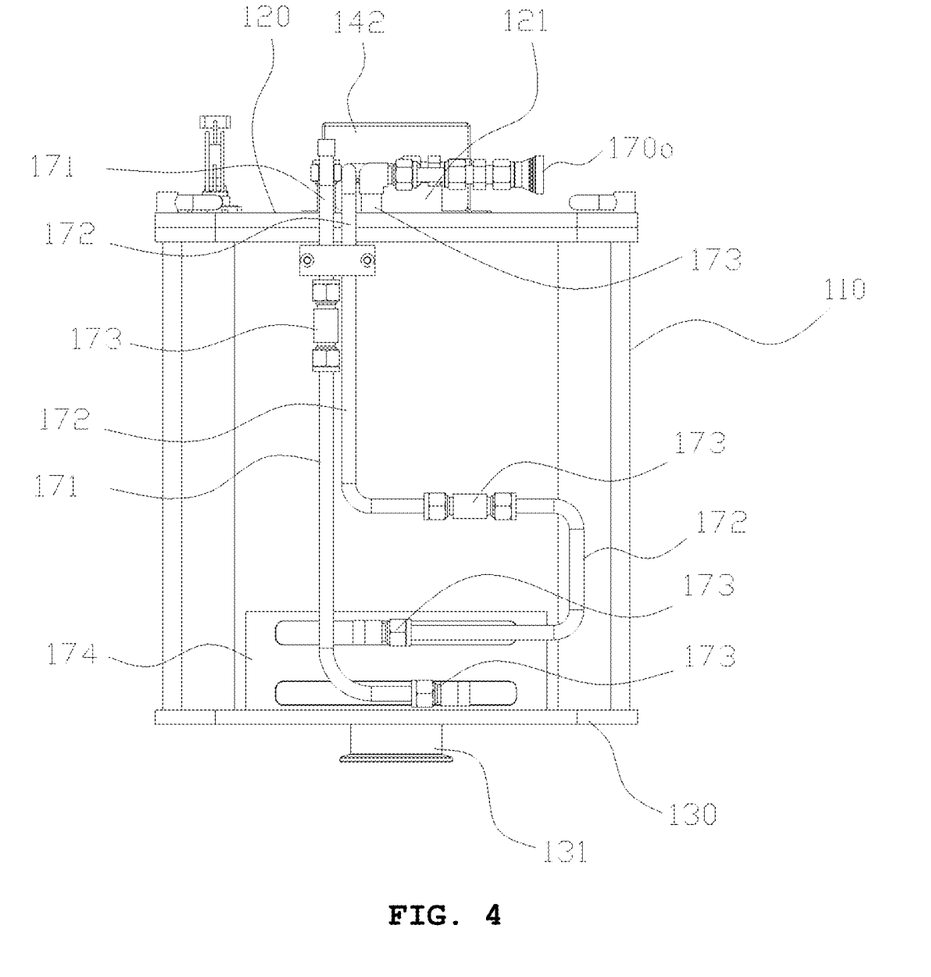
FIG. 4 is a side view showing the apparatus for collecting a by-product according to one embodiment of the present invention.
Figure 5:
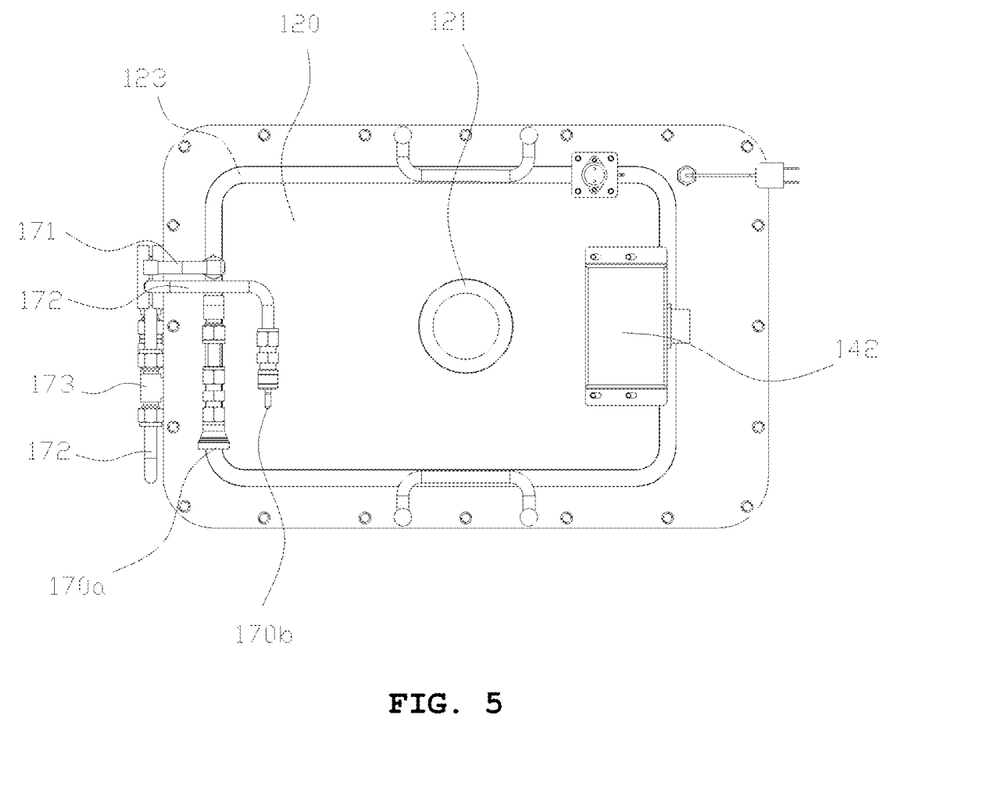
FIG. 5 is a plan view showing the apparatus for collecting a by-product according to one embodiment of the present invention.
Figure 6:
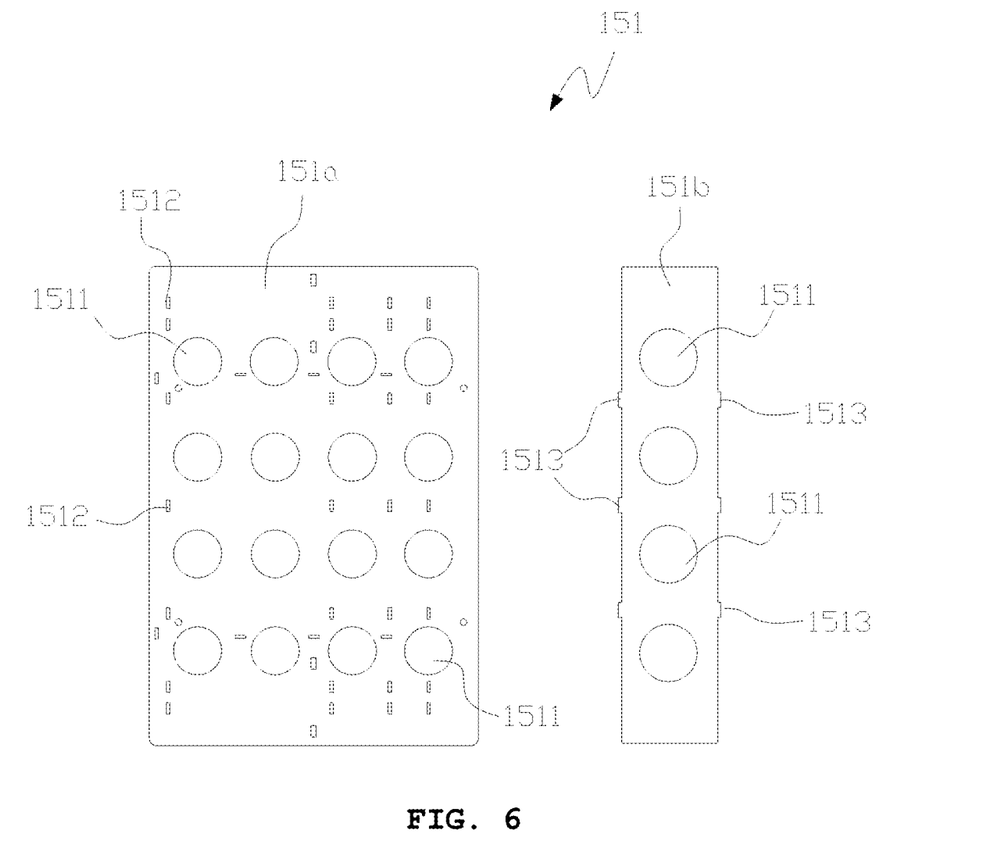
FIG. 6 is an exemplary view showing a vertical plate according to one embodiment of the present invention.
Figure 7:
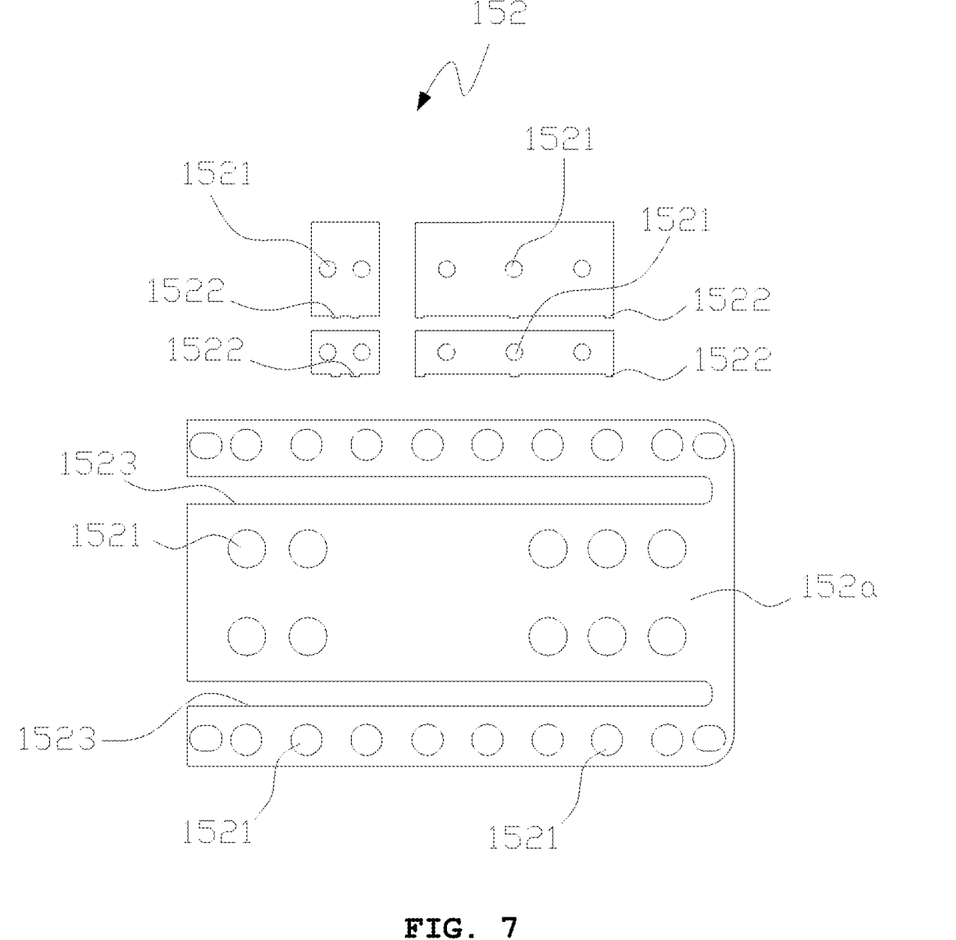
FIG. 7 is an exemplary view showing a type of horizontal plate according to one embodiment of the present invention.
Figure 8:
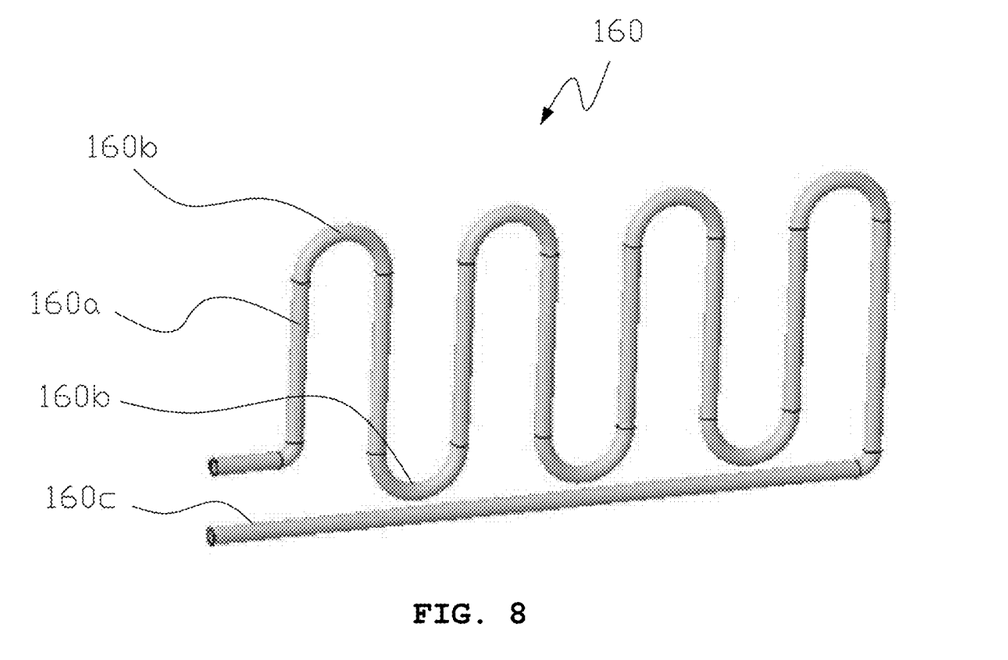
FIG. 8 is a perspective view showing a main cooling channel according to one embodiment of the present invention.

FIG. 1 is a perspective view showing an apparatus for collecting a by-product according to one embodiment of the present invention, FIG. 2 is an exploded perspective view showing the apparatus for collecting a by-product according to one embodiment of the present invention, FIG. 3 is a front sectional view showing the apparatus for collecting a by-product according to one embodiment of the present invention, FIG. 4 is a side view showing the apparatus for collecting a by-product according to one embodiment of the present invention, FIG. 5 is a plan view showing the apparatus for collecting a by-product according to one embodiment of the present invention, FIG. 6 is an exemplary view showing a vertical plate according to one embodiment of the present invention, FIG. 7 is an exemplary view showing a type of horizontal plate according to one embodiment of the present invention, and FIG. 8 is a perspective view showing a main cooling channel according to one embodiment of the present invention.

An apparatus having a cooling line for collecting a by-product in a semiconductor manufacturing process according to the present invention is an apparatus whereby particulate toxic gases, which are contained in exhaust gas discharged from a process chamber, are condensed and collected as a by-product, and the exhaust gas is discharged to a vacuum pump during a semiconductor process. In particular, this is an apparatus whereby particulate toxic gases contained in exhaust gas components discharged after use out of a process chamber that performs TiN-ALD and CVD processes are condensed as a high-density by-product on an internal collecting tower and a wall of a housing.

The apparatus largely includes: a housing 110 in which introduced exhaust gas is received and then discharged, and having a housing cooling channel 111 on an inner wall thereof to cool the introduced exhaust gas;

an upper plate 120 covering top of the housing 110, supplying the exhaust gas into the housing 110 through a gas inlet, and having an upper cooling channel for O-ring protection;

a lower plate 130 covering bottom of the housing 110, and discharging the exhaust gas from which the by-product is removed, through a gas outlet;

a heater 140 controlling the exhaust gas introduced into the housing to have an appropriate temperature distribution capable of by-product formation and uniformly distributing the exhaust gas to surroundings;

an internal collecting tower 150 provided inside the housing 110 at a location spaced apart upward from the lower plate 130 by a predetermined distance, and including multiple vertical plates and multiple horizontal plates that are assembled for providing a main cooling channel installation space and generating a vortex, the internal collecting tower condensing and collecting a by-product from the exhaust gas;

a main cooling channel 160 having a serpentine shape and cooling the exhaust gas uniformly by using coolant while passing through the internal collecting tower 150; and a multi-connection pipe 170 sequentially supplying the coolant to the upper plate cooling channel, the housing cooling channel, and the main cooling channel in a circulative manner and discharging the coolant, by using a supply pipe and a discharge pipe that are provided outside the housing 110.

In order to prevent corrosion caused by the exhaust gas discharged from the process chamber, most components of the apparatus for collecting a by-product according to the present invention are made of any one of stainless steel, aluminum, and other corrosion-resistant metals.

Hereinafter, each component of the apparatus for collecting a by-product will be described in detail.

The housing 110 having a hollow box shape serves to secure a gas channel space such that exhaust gas introduced into the internal collecting tower 150 provided therein is condensed for collection.

The housing 110 has an open top and bottom. When the internal collecting tower 150 is accommodated therein, open top and bottom spaces of the housing 110 are covered with the upper plate 120 and lower plate 130 and fixed using a fastening means such as a bolt.

Multiple housing cooling channels 111 are provided along the inner wall of the housing 110 at a regular interval over upper and lower regions. Due to the fact that the housing cooling channels 111 are wound around the upper and lower regions of the inner wall of the housing 110 at a regular interval, the exhaust gas introduced to the inner wall of the housing 110 is uniformly cooled and a by-product is uniformly condensed on the inner wall and the housing cooling channels 111.

The coolant supplied to the housing cooling channels 111 is not circulated in a closed circuit but passes through the housing 110 to communicate with two points of the multi-connection pipe 170 provided outside the housing 110, by branch sockets 173, such that the coolant maintains a constant temperature in accordance with the supplied temperature.

That is, the coolant introduced externally through one end of each of the housing cooling channels 111 is circulated along the inner wall of the housing and then discharged externally through the other end, such that the temperature around the inner wall is lowered to maintain an appropriate temperature during collection of by-products. This ensures that condensation of by-products in high-temperature exhaust gas occurs optimally.

Herein, the temperature of the coolant may be controlled depending on the components of introduced exhaust gas. Thus, the present invention does not limit a specific coolant temperature.

The upper plate 120 serves as a cover to cover the open top of the housing 110. The upper plate 120 includes a gas inlet 121 protruding upward of a gas hole to allow introduction of exhaust gas, and fixed by welding or the like. The gas inlet 121 receives exhaust gas discharged from the process chamber and supplies the exhaust gas into the housing 110.

The upper plate 120 serves to prevent that an O-ring (not shown) for airtightness provided on a lower portion of the upper plate 120 is deformed and deteriorated in function when the temperature of an internal space of the housing 110 is controlled in response to the operation of the heater 140 provided on a lower side of the upper plate 120. The upper plate 120 includes an upper plate cooling channel 122 formed in the form of a groove in an upper side thereof. The upper plate cooling channel 122 cools down exhaust gas that is introduced into the lower portion of the upper plate 120 and heated to a high temperature by the heater 140 in order to maintain an appropriate temperature when a by-product is collected. An upper portion of the upper plate cooling channel 122 in the form of a groove is covered by a channel cover 123 in a water-tight manner. To this end, although not shown in the drawings, the channel cover 123 may be fastened by including a sealing treated portion for water-tightness, and a fastening method may be a known technique such as fitting, welding, bolting, and the like.

The upper plate cooling channel 122 is configured such that coolant supplied externally is introduced through a first branch socket 173 connected to a coolant inlet 170a of the multi-connection pipe 170 and circulates, and then the coolant is discharged to the multi-connection pipe 170 through a second branch socket 173 to be supplied to the housing cooling channels 111 and the main cooling channel 160. The upper plate cooling channel 122 is configured to have a boundary portion such that ends thereof do not communicate with each other and thus supplied coolant and discharged coolant are not mixed with each other. The coolant may be water or a refrigerant.

The lower plate 130 serves as a cover to cover the open bottom of the housing 110. The lower plate 130 includes a gas outlet 131 protruding downward of a gas hole of a predetermined point and fixed by welding or the like. The gas outlet 131 is a passage through which exhaust gas that results from condensing and removing a by-product is discharged.

Furthermore, the lower plate 130 includes multiple supporters 132 protruding upward in the housing 110 at multiple points such that the supporters 132 support the load of the internal collecting tower 150 while spacing the internal collecting tower 150 upward from the lower plate 130 by a predetermined distance. A part of the supporters 132 spaces a horizontal plate located at the lowermost portion of the internal collecting tower 150 from the bottom of the housing 110 by a predetermined distance, and a remaining part of the supporters 132 supports horizontal plates that protrude outward to cross each of opposite vertical plates provided at the outermost portions of the internal collecting tower 150.

The fastening between the supporters 132 and the internal collecting tower 150 may be realized by a simple fitting method, by using a fastening member such as a bolt, or by various other known fastening methods.

The heater 140 is mounted to the upper plate 120 by a fastening method such as bolting, welding, or the like so as to be close to a lower end of the gas inlet 121, such that exhaust gas introduced into the housing 110 is controlled to have an appropriate temperature distribution capable of by-product formation.

The heater 140 further includes a heat distribution plate 141 provided therebelow by a fastening means at a location spaced apart downward by a predetermined distance. The heat distribution plate 141 transfers heat generated from the heater 140 to a far region in a lower space of the upper plate 120 while preventing the heat from being directly transferred to top of the internal collecting tower 150.

The heat distribution plate 141 includes multiple gas holes 1411 formed in end portions thereof. The heat distribution plate 141 is configured to be larger in size than the heater 140 and than the top area of the internal collecting tower 150 located below the heat distribution plate 141.

The heat distribution plate 141 configured as described above supplies a part of exhaust gas passing through the gas holes 1411 formed in the end portions thereof toward top of the internal collecting tower 150 located below the heat distribution plate 141, and the heat distribution plate 141 supplies a remaining part of exhaust gas toward the inner wall of the housing 110 located sideward of the heat distribution plate 141.

The fastening between the heat distribution plate 141 and the heater 140 may be realized by bolting. Other fastening methods may be known fastening methods, and thus a detailed description thereof will be omitted.

When the power is applied to the heater 140 from a heater power supply unit 142 having a temperature sensor and provided on an upper side of the upper plate 120, the heater 140 generates heat of a predetermined temperature.

The temperature of the heater 140 may be set differently for each type of exhaust gas. The heater 140 is made of a material such as ceramic or inconel to prevent corrosion caused by exhaust gas. A basic shape of the heater 140 is a configuration in which multiple radiating fins (or radiating plates) are arranged in a radial arrangement such that heat is radiated uniformly.

The heater 140 serves to allow exhaust gas discharged from the process chamber to be introduced through the gas inlet 121 of the upper plate 120 without causing the exhaust gas to be condensed and clog the gas inlet 121, and to allow maximum condensation to occur when the exhaust gas reaches the internal collecting tower 150.

The heater 140 having the radiating fins arranged in a radial arrangement as described above ensures that temperature-controlled exhaust gas is uniformly supplied to the internal space of the housing 110, allowing uniform condensation to occur.

Furthermore, another reason of provision of the heat distribution plate 141 is to prevent a case where when gas in which the amount of light gas in exhaust gas discharged from the process chamber is higher than the amount of heavy gas is supplied in accordance with a semiconductor manufacturing process change, exhaust gas present on a side far from the heater 140 is cooled faster than that on a side near to the heater 140 and thus a high-density by-product is condensed on a portion of an upper side far from the heater 140 and clogs a space channel before reaching the internal collecting tower 150 for collection, or a case where when the exhaust gas is cooled to a temperature lower than that of the aforementioned case, a low-density porous by-product is formed and clogs the space channel. To this end, the heat distribution plate 141 is located below the heater 140 as described above, thus ensuring that heat is conducted and transferred farther.

The internal collecting tower 150 is accommodated inside the housing 110. The internal collecting tower 150 condenses exhaust gas to collect a high-density byproduct, while increasing a contact channel with the exhaust gas and the time the exhaust gas stays.

The internal collecting tower 150 includes the multiple vertical plates 151 and the multiple horizontal plates 152 that are fitted together to form an assembly. Each of the vertical plates 151 has gas holes 1511 formed in the surface thereof for movement of exhaust gas, and each of the horizontal plates 152 has gas holes 1521 formed in the surface thereof for movement of exhaust gas.

For such fitting engagement, each of the vertical plates 151 includes multiple fitting holes 1512 and multiple fitting pieces 1513 that are used for assembly, in addition to the gas holes 1511. Similarly, each of the horizontal plates 152 includes multiple fitting pieces 1522 used for assembly, in addition to the gas holes 1521.

The gas holes 1511 formed in the vertical plates 151 are relatively larger in size than the gas holes 1521 formed in the horizontal plates 152, such that introduction of exhaust gas is performed more efficiently.

On the contrary, the gas holes 1521 formed in the horizontal plates 152 are formed to be smaller in size than the gas holes 1511 formed in the vertical plates 151. This ensures that introduction of exhaust gas in the vertical direction is relatively reduced and is guided to flow outward toward the inner wall of the housing 110 in the lateral direction so as to spread uniformly inside the housing 110.

In one embodiment, the vertical plates 151 are configured such that multiple main vertical plates 151*a* are arranged, and at least two spacing vertical plates 151*b* are fitted to cross two main vertical plates 151*a* to form the interval therebetween. In this manner, each two of remaining main vertical plates 151*a* are also assembled.

Furthermore, a spacing plate 153 is welded to a lower end portion of each of opposite main vertical plates 151*a* located at the outermost portions, such that the vertical plates 151 are spaced apart a predetermined distance from a base horizontal plate 152*a* located at the lowermost portion, and the main cooling channel 160 passes through the internal collection tower 150. To this end, each of the respective spacing plates 153 is configured to be bent such that a first side thereof is welded to the main vertical plate 151*a*, and a second side is welded to the base horizontal plate 152*a* located at the lowermost portion.

The reason for assembling the two main vertical plates 151*a* with the spacing vertical plates 151*b* is that because the main cooling channel 160 constituting the present invention has a serpentine shape with peak and troughs repeated up and down and passing through the internal collecting tower to uniformly cool exhaust gas introduced thereinto, the main cooling channel 160 needs to be installed such that the two main vertical plates are located above the space between two neighboring troughs forming lower portions of the serpentine shape.

Accordingly, it is necessary that the width of each of the spacing vertical plates 151*b* is smaller than the width between the two neighboring troughs of the main cooling channel 160 such that the spacing vertical plate 151*b* is located between the two neighboring troughs.

Furthermore, the multiple horizontal plates 152 provide the interval like the spacing vertical plates crossing the two main vertical plates to provide the interval, while being arranged up and down unlike the spacing vertical plates. This is to play a role in spreading uniformly moving exhaust gas while generating a vortex in the exhaust gas and retarding the flow thereof.

That is, a part of the multiple horizontal plates is arranged in the space between two main vertical plates 151*a* at which no spacing vertical plates are provided. These horizontal plates have the same width and different lengths.

Furthermore, a remaining part of the horizontal plates is provided at each of opposite main vertical plates of the inner collecting tower 150 so as to protrude outward, such that a vortex is generated and retards the flow of exhaust gas, thus ensuring that the exhaust gas is sufficiently condensed.

Meanwhile, the base horizontal plate 152*a* that is the lowermost one of the horizontal plates 152 has the gas holes 1521 such that exhaust gas is moved up and down like other horizontal plates. However, unlike the horizontal plates which are arranged between the vertical plates for providing the interval as described above, the base horizontal plate 152*a* is a plate that forms a base of all of the vertical plates and horizontal plates, and the multiple vertical plates and the multiple horizontal plates are located thereabove. That is, due to the fact that the second side of each of the spacing plates 153 is welded to the base horizontal plate 152*a*, the opposite main vertical plates 151*a* located at the outermost portions are spaced apart from the base horizontal plate by a predetermined distance. Thus, the base horizontal plate 152*a* supports the load of all the integrally assembled vertical plates and horizontal plates together while being spaced apart therefrom. Furthermore, the base horizontal plate 152*a* is spaced apart a predetermined distance from the bottom of the housing 110 by the supporters.

Furthermore, the base horizontal plate 152*a* serves to prevent a by-product from falling directly into the gas outlet 131.

In addition to the gas holes of different sizes for movement of exhaust gas, the base horizontal plate 152a includes at least one pipe slit 1523 such that the main cooling channel 160 passes through an internal space of the internal collecting tower 150. This ensures that a pipe located below the main cooling channel 160 is installed without interference. The pipe slit 1523 is an integral structure in which an opening is formed only in one direction of the base horizontal plate 152a.

In the internal collecting tower 150 in which the multiple vertical plates and the multiple horizontal plates are fitted together as described above, exhaust gas cooled by the main cooling channel 160 comes into contact with the surface thereof while the exhaust gas introduced into the internal collecting tower 150 generates a vortex, and edge effect due to protruding structures occurs. This allows condensation of the exhaust gas to be increased, resulting in an increase in collection efficiency.

The main cooling channel 160 has a serpentine shape in which multiple vertical pipes 160a and curved pipes 160b alternately connecting upper ends and lower ends of neighboring vertical pipes to each other are arranged repeatedly up and down. The coolant flowing in the main cooling channel 160 passing through the internal collecting tower 150 cools surrounding exhaust gas to condense the exhaust gas at high density in the upper and lower regions of the vertical plates and on the surfaces of the horizontal plates, the vertical and horizontal plates constituting the internal collecting tower 150. Then, the coolant cooled the surroundings while passing through the main cooling channel 160 having a serpentine shape is discharged through a horizontal pipe 160c constituting a lower portion of the main cooling channel 160.

Herein, the temperature of the coolant flowing through the main cooling channel 160 may be controlled depending on the type of introduced exhaust gas to control condensation.

Two main cooling channels 160 may be provided as shown in one embodiment of the present invention. Alternatively, two or more main cooling channels 160 may be provided. Such a configuration ensures that exhaust gas flowing through the internal collecting tower 150 is cooled in a much shorter time. This therefore results in the vertical plates 151 and the horizontal plates 152 constituting the internal collecting tower 150 being cooled uniformly, allowing a by-product to be condensed uniformly at high density.

The main cooling channels 160 configured as described above not only serve to allow a by-product contained in exhaust gas to be condensed on the surface of the internal collecting tower 150 by uniformly cooling the internal collecting tower 150, but also serve to allow the by-product to be collected on the surfaces of the main cooling channels while being in contact with the exhaust gas, whereby the overall collection efficiency is increased.

The multi-connection pipe 170 includes a coolant supply pipe 171 and a coolant discharge pipe 172 that are connected to respective branch sockets 173 provided at a location in which coolant is supplied to the housing cooling channel 111, the upper plate cooling channel 122, and the main cooling channels 160 and a location in which the coolant is discharged, such that the coolant is circulated.

Introduced coolant is configured to circulate in connection with outside rather than in a closed circuit, such that coolant as a new heat source is supplied continuously instead of heat-exchanged coolant. To this end, a coolant source, a coolant supply pump, and a coolant storage tank, which are not shown, may be provided. A heat exchanger may be further provided as necessary.

In detail, in the multi-connection pipe 170, coolant is introduced through the first branch socket 173 of the upper plate cooling channel connected to the coolant inlet 170a and circulates. Then, the coolant is discharged to the supply pipe 171 of the multi-connection pipe 170 through the second branch socket 173, and the coolant is supplied to the housing cooling channel 111 through a branch socket 173 located at a first point, and to the main cooling channels 160 through a branch socket 173 located at a second point.

The supplied coolant flows through each of the housing cooling channel 111 and the main cooling channels 160 and then is discharged to the discharge pipe 172 through respective branch sockets 173 connected to ends of the housing cooling channel 111 and the main cooling channels 160. Then, the coolant is discharged an external pipe or to a coolant tank (not shown) through a coolant outlet 170b located at an end of the discharge pipe 172.

Meanwhile, when two or more main cooling channels 160 are provided, the multi-connection pipe 170 includes a coolant chamber 174 to simultaneously supply and discharge coolant to and from the two or more main cooling channels.

The coolant chamber 174 has a structure in which upper and lower spaces are isolated from each other. In such a structure, coolant supplied from the supply pipe 171 of the multi-connection pipe is introduced into the upper space and supplied to each of the main cooling channels 160, and the coolant discharged after circulating through each of the main cooling channels 160 is collected in the lower space and discharged to the discharge pipe 172.

Due to such provision of the coolant chambers 174, it is ensured that coolant is supplied simultaneously to each of the main cooling channels 160 without requiring provision of complicated pipes or branch sockets according to the number of the main cooling channels 160, and then coolant resulting from heat exchange through the internal collecting tower 150 is discharged simultaneously through outlets of the main cooling channels 160.

Figure 9:
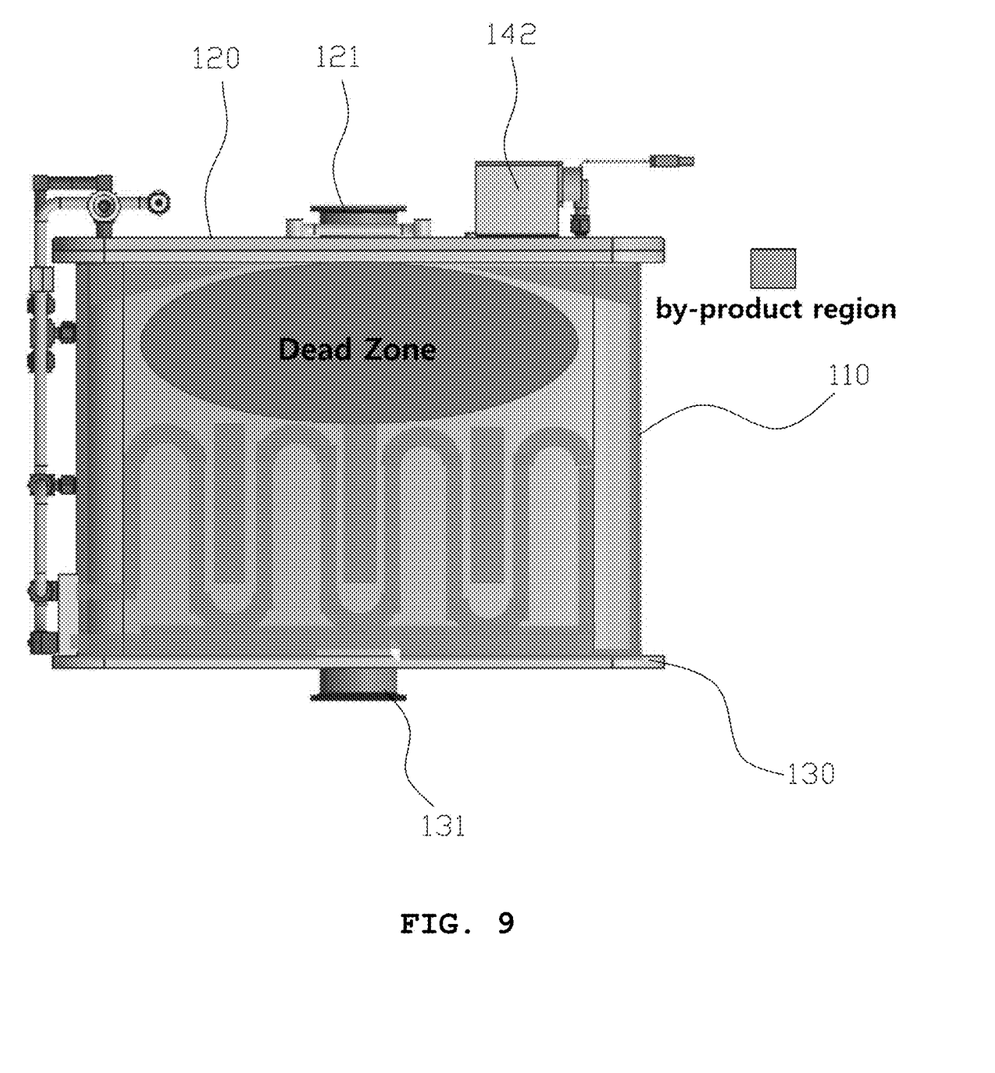
FIG. 9 is an exemplary view showing a by-product collection tendency in each region of the apparatus for collecting a by-product according to one embodiment of the present invention.

FIG. 9 is an exemplary view showing a by-product collection tendency in each region of the apparatus for collecting a by-product according to one embodiment of the present invention.

As shown in the figure, it can be ascertained that from exhaust gas introduced into the apparatus for collecting a by-product according to the present invention, high-density by-products are distributed and collected uniformly on lower outside portions of the upper plate on the inner wall of the housing, the housing cooling channel, the main cooling channel, and the internal collecting tower.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for collecting a by-product in a semiconductor manufacturing process, the apparatus being provided on a line between a process chamber and a vacuum pump to collect the by-product in an exhaust gas, which is discharged from the process chamber, the apparatus comprising:

a housing including an upper plate through which the exhaust gas is introduced, the upper plate including a gas inlet and an upper plate cooling channel which is accommodated in the upper plate, the housing further including a lower plate through which the exhaust gas is discharged, the lower plate including a gas outlet, the housing further including a housing cooling channel on an inner wall thereof to cool the exhaust gas which is temperature-controlled by a heater while the exhaust gas is introduced through the gas inlet of the upper plate;

an internal collecting tower provided inside the housing at a location spaced apart upward from the lower plate by a predetermined distance, and including multiple vertical plates and multiple horizontal plates that are assembled for providing a main cooling channel installation space and generating a vortex, the internal collecting tower configured to condense and collect the by-product from the exhaust gas;

a main cooling channel of a serpentine shape configured to cool the exhaust gas uniformly by using a coolant, the main cooling channel at least partially disposed in the internal collecting tower; and a multi-connection pipe configured to sequentially supply the coolant to the upper plate cooling channel, the housing cooling channel, and the main cooling channel in a circulative manner and discharge the coolant, by using a coolant supply pipe and a coolant discharge pipe that are provided outside the housing.

2. The apparatus of claim 1, wherein the apparatus includes multiple housing cooling channels that are arranged along the inner wall of the housing at regular intervals over upper and lower regions of the inner wall, such that the coolant is supplied to the coolant supply pipe through the multi-connection pipe provided outside the housing.

3. The apparatus of claim 1, wherein the upper plate cooling channel of the upper plate is configured such that the coolant supplied from outside the housing is introduced through a first branch socket connected to a coolant inlet of the multi-connection pipe, the coolant circulates, and the coolant is discharged to the multi-connection pipe through a second branch socket to be supplied to the housing cooling channel and the main cooling channel.

4. The apparatus of claim 1, wherein the internal collecting tower is configured such that the multiple vertical plates and the multiple horizontal plates are fitted together, each of the multiple vertical plates including a gas hole and a fitting hole or a fitting piece, each of the multiple horizontal plates including a gas hole and a fitting piece, wherein the multiple vertical plates are configured such that at least two spacing vertical plates are fitted to connect each of two neighboring main vertical plates of multiple main vertical plates to form an interval therebetween, and a set of the multiple horizontal plates is are arranged up and down in a space between two main vertical plates at which no spacing vertical plates are provided and provide an interval therebetween to generate the vortex in the exhaust gas to allow a flow of the exhaust gas to be retarded and spread uniformly.

5. The apparatus of claim 4, wherein a remaining set of the multiple horizontal plates are provided at outer main vertical plates of the inner collecting tower so as to protrude outward such that the vortex is generated and retards the flow of the exhaust gas, and a spacing vertical plate is welded to a lower end portion of each of the outer main vertical plates such that the multiple vertical plates are spaced apart a predetermined distance from a base horizontal plate located at a lowermost portion.

6. The apparatus of claim 4, wherein among the multiple horizontal plates, a base horizontal plate located at a lower portion is configured such that a spacing vertical plate is welded thereto, whereby the base horizontal plate supports a load of all the assembled multiple vertical plates and the multiple horizontal plates while being spaced apart therefrom, and the base horizontal plate includes at least one pipe slit allowing the main cooling channel to pass through the internal collecting tower.

7. The apparatus of claim 4, wherein the gas hole formed in each of the multiple vertical plates is relatively larger in size than the gas hole formed in each of the multiple horizontal plates such that introduction of the exhaust gas is promoted.

8. The apparatus of claim 1, wherein the main cooling channel having the serpentine shape is configured such that multiple vertical pipes and curved pipes are alternately connected to one another and such that upper ends and lower ends of neighboring vertical pipes are connected to the curved pipes, whereby the coolant flowing in the main cooling channel passing through the internal collecting tower cools surrounding exhaust gas to condense the exhaust gas in upper and lower regions of the multiple vertical plates and on surfaces of the multiple horizontal plates, the multiple vertical plates and the multiple horizontal plates constituting the internal collecting tower and the coolant having cooled surroundings while passing through the main cooling channel is discharged through a horizontal pipe.

9. The apparatus of claim 1, wherein the main cooling channel is one of two or more main cooling channels.

10. The apparatus of claim 9, wherein the multi-connection pipe includes the coolant supply pipe and the coolant discharge pipe that are connected to branch sockets provided at a location where the coolant is supplied to the housing cooling channel, the upper plate cooling channel, and the main cooling channel and a location where the coolant is discharged, sequentially, such that the coolant is circulated.

11. The apparatus of claim 10, wherein when the two or more main cooling channels are provided, the multi-connection pipe includes a coolant chamber which is in fluid communication with the two or more main cooling channels for simultaneous supply and discharge of the coolant.

12. The apparatus of claim 1, wherein the heater further includes a heat distribution plate provided at a lower portion thereof by a fastening means so as to be spaced apart downwardly by a predetermined distance from the upper plate, the heat distribution plate having multiple gas holes formed in end portions thereof such that the heat distribution plate is configured to direct a part of the supplied exhaust gas below the heat distribution plate, and to direct a remaining part of the supplied exhaust gas toward the inner wall of the housing and to sides of the heat distribution plate.

* * * * *